United States Patent [19]

Dean et al.

[11] Patent Number: 4,529,353
[45] Date of Patent: Jul. 16, 1985

[54] WAFER HANDLING APPARATUS AND METHOD

[75] Inventors: Robert E. Dean, High Bridge; Edward A. Dein, Union, both of N.J.

[73] Assignee: AT&T Bell Laboratories, Murray Hill, N.J.

[21] Appl. No.: 461,531

[22] Filed: Jan. 27, 1983

[51] Int. Cl.³ .......................................... B65G 47/90
[52] U.S. Cl. ................................ 414/786; 414/404; 414/225
[58] Field of Search .............. 414/222, 225, 331, 404, 414/411, 416, 417, 751, 752, 786; 269/21, 903; 29/426.3, 426.6, 559

[56] References Cited

U.S. PATENT DOCUMENTS 3,823,836  7/1974  Cheney et al. ................. 414/225
3,986,623  10/1976 Keller .......................... 414/222 X
4,056,198  11/1977 Boserup ........................ 414/416 X
4,298,443  11/1981 Maydan ........................ 204/298 X
4,378,189  3/1983  Takeshita et al. ............... 414/225

FOREIGN PATENT DOCUMENTS 54-54380  4/1979  Japan ........................... 414/225

Primary Examiner—Robert J. Spar
Assistant Examiner—David A. Bucci
Attorney, Agent, or Firm—Lucian C. Canepa

[57] ABSTRACT

Compact apparatus characterized by cleanliness of operation, high throughput and low cost is designed for automatically loading and unloading wafer-carrying trays that are designed to be mounted in the reaction chamber of a processing system. A key component of the apparatus comprises a unique wafer vacuum chuck.

2 Claims, 4 Drawing Figures

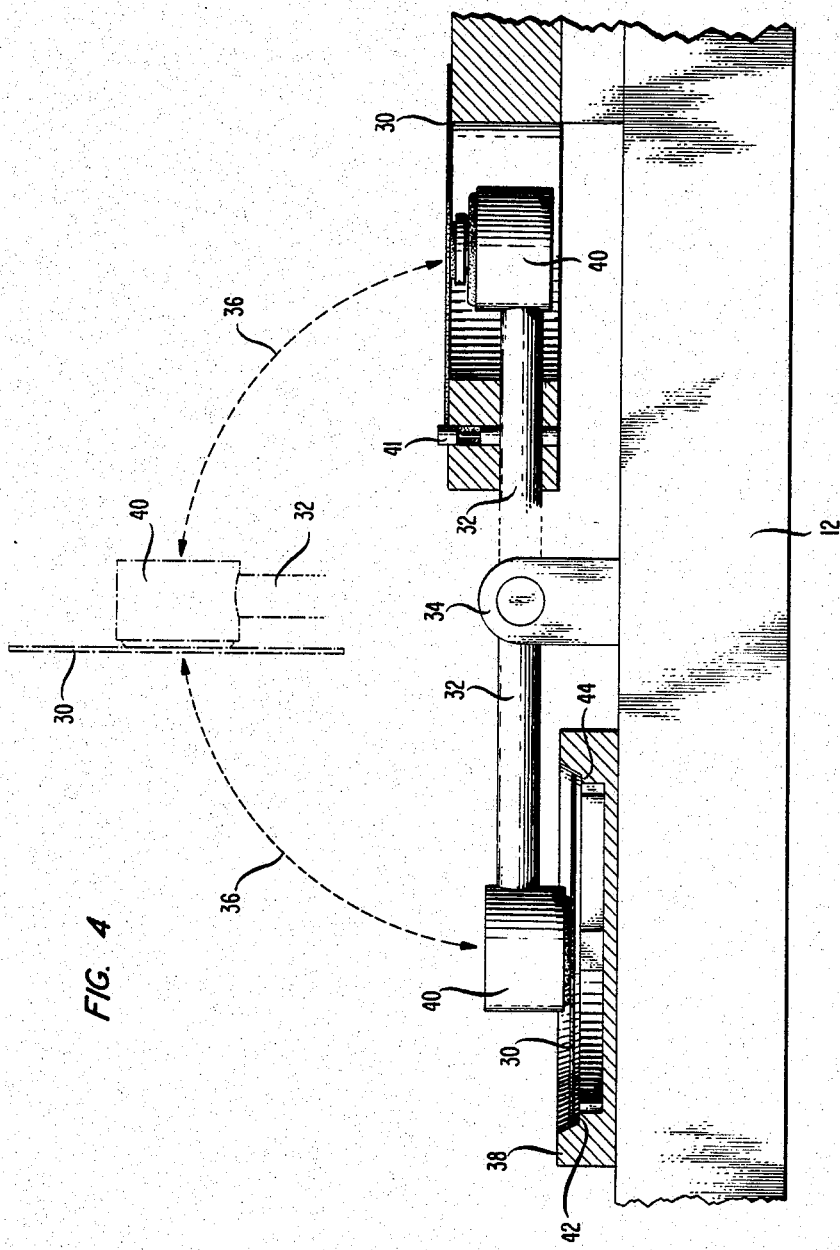

WAFER HANDLING APPARATUS AND METHOD

BACKGROUND OF THE INVENTION

This invention relates to wafer handling, and more particularly, to an apparatus and a method for handling wafers in a fabrication processing sequence.

In a number of applications of commercial importance, thin fragile disk-like elements must be picked up, transported and mounted for processing. These elements comprise, for example, semiconductor wafers. Such wafers must be handled carefully to avoid contamination, scratching, chipping or breaking. During and between processing steps, the handling of such fragile wafers in a high-throughput manner that meets stringent cleanliness requirements poses a considerable practical challenge.

One illustrative system designed for processing wafers is described in U.S. Pat. No. 4,298,443. The described system is designed to carry out dry etching of wafers. In that system, wafers to be etched are loaded into tray members. The wafer-carrying tray members are then mounted in the reaction chamber of the etching system on the respective facets of a longitudinally extending multifaceted electrode.

After the wafers have been etched in the system described in the aforecited patent, the tray members are removed from the chamber. The wafers are subsequently unloaded from the members and moved to a storage medium to await the next step in the wafer processing sequence.

Thus, in the course of the specified wafer etching process, wafers must be picked up and transported a number of times. They must be moved into and out of the storage medium. Further, they must also be loaded into and out of the wafer-carrying tray members. These various operations as well as other steps in the overall wafer fabrication sequence impose a number of difficult requirements on the design of a wafer handling system. A critical part of such a system comprises a suitable wafer pickup tool.

Accordingly, considerable effort has been expended by workers directed at developing improved wafer handling techniques. It was recognized that such efforts, if successful, could lead to wafer handling apparatus and methods for significantly enhancing the efficiency and thereby lowering the cost of wafer fabrication. In turn, the cost of commercially important devices such as integrated circuits formed on the wafers could thereby be reduced.

SUMMARY OF THE INVENTION

Hence, an object of the present invention is to improve wafer handling. More specifically, an object of the invention is an improved apparatus and method for handling wafers that are to be processed in a device fabrication sequence.

Briefly, these and other objects of the present invention are realized in a specific illustrative wafer handling embodiment that includes a unique wafer vacuum chuck design. The illustrative embodiment is especially adapted to load and unload wafer-carrying tray members of a type intended to be mounted in the reaction chamber of a processing system.

During a loading mode of operation of the illustrative embodiment, wafers are removed one at a time from a storage medium and conveyed to an initial loading position. At that position, the active or device side of each wafer is face up. A vacuum chuck at the end of a flipper arm engages the bottom or inactive side of the wafer. The wafer is then turned upside down and transported to a fixture at an intermediate loading position. Subsequently, a transport stage carrying another vacuum chuck is moved to the intermediate position. The top or inactive side of the wafer is engaged by the chuck. The wafer is then carried by the transport stage to a loading position directly overlying an empty opening in a tray member to be loaded.

After a tray member is completely loaded, it is manually moved either to a tray storage rack or directly into the reaction chamber of a processing system. An empty tray member is then manually positioned in place and another automatic loading cycle commences.

During an unloading cycle, wafers are sequentially removed from a tray member and conveyed active face down to the intermediate loading position. Each wafer is then picked up by the flipper arm mechanism and moved to the initial loading position. From there, the wafer is moved into the storage medium. At the end of the unloading cycle, a set of wafers is available in the storage medium ready to be delivered to a processing station for the next step in the fabrication sequence.

The wafer vacuum chuck included in the illustrative embodiment must meet several different requirements. Significantly, a single unique chuck design has been developed to satisfy all these requirements.

The chucks included in the illustrative embodiment each comprise a hollow centrally positioned compliant bellows having an O-ring on the free end thereof. The other end of the bellows is securely mounted to a rigid housing that contains an encompassing O-ring. The surface of this latter O-ring constitutes a plane that is parallel to a reference plane defined by a lower surface of the rigid housing. The surfaces of the two O-rings lie in spaced-apart planes. Importantly, the surface of the bellows O-ring extends out beyond the surface of the housing O-ring. As a result, the compliant free end of the flexible bellows makes first contact with a planar wafer surface to be engaged.

During a wafer pickup operation, the bellows O-ring of the chuck contacts the wafer surface. After the bellows is thereby slightly compressed and the bellows O-ring is in intimate contact with the wafer surface, vacuum is applied to the hollow interior of the bellows. This causes the bellows to be further compressed until the wafer surface moves into intimate contact with the O-ring on the rigid housing. At that point, the wafer is firmly held in alignment with the reference plane.

BRIEF DESCRIPTION OF THE DRAWING

A complete understanding of the present invention and of the above and other features thereof may be gained from a consideration of the following detailed description presented hereinbelow in connection with the accompanying drawings, in which:

FIG. 4 is a schematic representation of a portion of the FIG. 1 apparatus.

DETAILED DESCRIPTION

Figure 1:
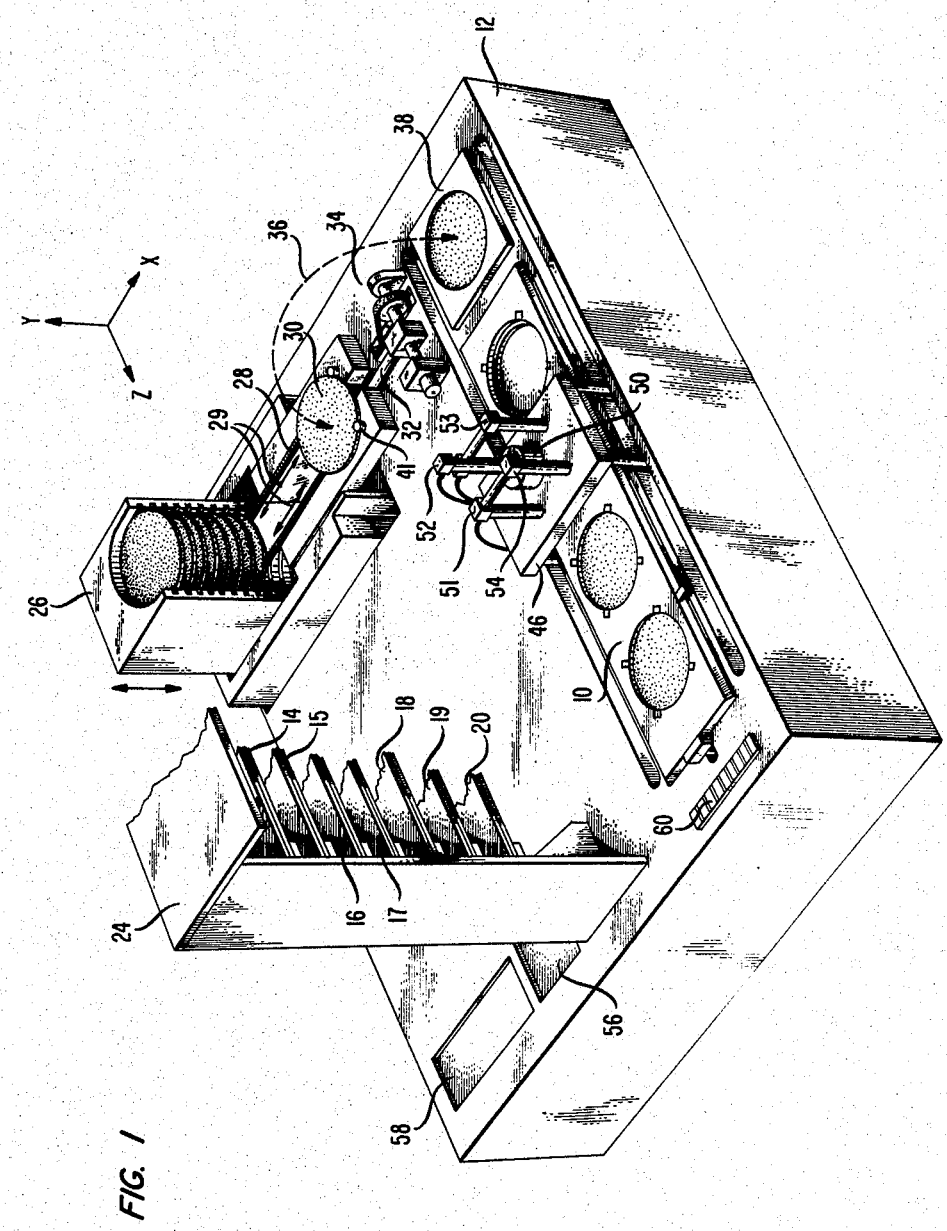
FIG. 1 is a schematic depiction of a specific illustrative wafer-handling apparatus made in accordance with the principles of the present invention.

The specific illustrative wafer handling apparatus shown in FIG. 1 is designed to load and unload tray members of the particular type described in the aforecited patent. One such tray member 10 is shown mounted on the top surface of a base portion 12 of the apparatus. The depicted member 10 has four apertures therethrough. Four wafers are intended to be respectively mounted in these apertures. Specifically, each wafer is resiliently held within its associated aperture by means of at least three peripherally disposed spring-clip elements, as described in detail in the aforecited patent. (Herein, for purposes of a specific illustrative example, four such elements per aperture will be assumed.)

Portions of seven other apertured tray members 14 through 20 mounted in a storage rack 24 are shown in FIG. 1. The rack 24 is fixedly secured to the base portion 12 by any suitable means.

Further, the FIG. 1 apparatus includes a standard cassette 26 designed to hold multiple wafers. The cassette 26, which is removable from the depicted apparatus, includes an open side through which wafers are inserted into and removed from the cassette. Slots formed on the insides of the side walls of the cassette serve to hold mounted wafers in a spaced-apart fashion. Multiple wafers are shown mounted in the cassette 26. Illustratively, the cassette is made of a suitable plastic material, as is well known in the art.

By standard means (not shown), the cassette 26 can be moved up and down along the y axis indicated in FIG. 1. In that way, a wafer to be removed from the cassette can be lowered into contact with a driven rubber conveyer belt 28. The wafer is then carried from the cassette by the belt 28.

The belt 28 shown in FIG. 1 is also utilized to insert wafers into the cassette 26. If necessary before insertion, the cassette is first moved upward to position a pair of empty aligned slots in registry with a wafer to be carried into the cassette by the belt 28. As indicated by arrow 29, the belt 28 is adapted to be driven in one direction for inserting wafers into the cassette 26 and in the opposite direction for removing wafers therefrom.

The aforedescribed wafer insertion/removal mechanism that includes the cassette 26 and the belt 28 shown in FIG. 1 may comprise, for example, a standard commercially available unit. Such a unit is exemplified by the Siltec type 2061A unit, manufactured by Siltec Corp.

In FIG. 1, wafer 30 represents either a wafer that has been removed from the cassette 26 for subsequent loading into the tray member 10 or a wafer that has been already unloaded from the member 10 and is to be inserted into the cassette 26. In either case, the wafer 30 is shown in the indicated position with its active or device side face up.

First, a loading cycle of operation will be described. In that case, the wafer 30 is assumed to have been removed from the cassette 26. At its depicted or initial loading position, the under side of the wafer 30 is engaged by a vacuum chuck which will be described in detail later below. The chuck is fixedly mounted on the free end of a flipper arm 32. In a conventional fashion, the other end of the arm 32 is secured to a rotatable assembly 34 that is driven by a motor and controlled by cam-actuated limit switches (not shown). By means of the assembly 34, the arm 32 can be made to rotate 180 degrees, as indicated by arrow 36.

When the arm 32 is moved from the position shown in FIG. 1 to a position 180 degrees removed therefrom, the wafer 30 is thereby carried to an intermediate loading position. In that position, the transported wafer is retained by a fixture 38. As retained in the fixture 38, the wafer has its active side disposed face down. As a result, the chances of contaminating the critical or active side of the wafer during subsequent handling steps is significantly reduced.

The transporting of the wafer 30 from its initial loading position to the fixture 38 is schematically depicted in FIG. 4. As indicated on the right-hand side of FIG. 4, vacuum chuck 40 is shown as it makes initial contact with the underside of the wafer 30. Thereafter, the wafer is securely engaged by the chuck 40 and carried toward the fixture 38.

Pneumatically-operated pin 41 in FIG. 4 is one of several positioning pins included at the initial loading position. The pins ensure that accurate registration of a wafer with respect to the pick-up chuck 40 will occur.

Illustratively, the fixture 38 shown in FIG. 4 is made of a plastic material such as nylon. The fixture includes a tapered opening. Several spaced-apart tabs or shoulders at the bottom of the opening serve to support a wafer that is inserted into the top of the fixture. Two such tabs 42 and 44 are indicated in FIG. 4. By way of a specific example, four tabs are included in the fixture. The tabs contact the same peripheral band of the wafer as do the aforementioned spring-clip elements included in the tray members.

In practice, the chuck 40 affixed to the rotatable arm 32 releases the wafer 30 when the bottom side of the wafer is slightly above the noted tabs (at about the position shown in the left-hand side of FIG. 4). As the wafer falls, it is accurately aligned in position by the sloping walls of the opening in the fixture 38.

After releasing a wafer into the fixture 38 of FIG. 4, the arm 32 with its affixed chuck is rotated approximately 180 degrees to a position slightly below that represented in the right-hand side of FIG. 4. At that point, another wafer can be moved from the cassette 26 (FIG. 1) into the initial loading position ready for subsequent transport to the fixture 38.

Movement of a wafer from the fixture 38 of FIG. 1 to an available opening in the tray member 10 is carried out by a transport stage 46. The movable stage 46 is mounted on standard linear bearings and driven back and forth along the z axis by a conventional stepper motor. The stage 46 includes another vacuum chuck 50 and four pneumatically-controlled pistons 51 through 54. By standard means the chuck 50 and the pistons 51 through 54 are mounted on the transport stage 46 for movement therewith.

The aforementioned pistons are aligned in exact registration with the four spaced-apart spring-clip elements included around the periphery of each wafer-receiving opening in the tray member 10. By means of the pistons, the spring-clip elements are retracted to permit easy insertion or removal of wafers, as described in detail in the aforecited patent. As a result, damage to and contamination of wafers during insertion or removal is virtually eliminated.

During the loading cycle, the transport stage 46 is moved to a position directly overlying a wafer retained in the fixture 38 of FIG. 1. At that point, the chuck 50 is lowered to engage the top surface of the wafer positioned in the fixture. Next, the stage 46 is moved to a location directly overlying an empty opening in the tray member 10. This is determined, for example, by a standard photoelectric sensor. The pistons 51 through 54 are then moved downward to retract the respectively associated spring-clip elements included around the periphery of the tray opening. Subsequently, the chuck 50 and the wafer held thereby are lowered into the tray opening. When the wafer is positioned at a prespecified level in the opening within the retracted spring-clip elements, the pistons are raised, whereby the elements are released to resiliently engage peripheral portions of the wafer. At that point, the vacuum chuck 50 is deactivated and raised away from the securely engaged wafer. The transport stage 46 is then ready to return to the fixture 38 for pick-up of another wafer.

After the tray member 10 shown in FIG. 1 is completely loaded with wafers, the member 10 is released from the base portion 12. The loaded tray member 10 is then manually mounted either in the storage rack 24 or directly in the reaction chamber of a processing apparatus such as a reactive sputter etching machine. Subsequently, another empty tray member can be mounted on the base portion 12 to initiate another wafer loading cycle of the type described above.

To start an unloading cycle of operation, a tray member having a number of partially or fully processed wafers therein is mounted on the base portion 12 (in the same position occupied by the tray member 10 shown in FIG. 1). By means of the transport stage 46, the wafers are sequentially picked up and moved to the fixture 38. This is done in each case by retracting the spring-clip elements that hold a wafer in place in the tray member and engaging the top surface of the wafer with the vacuum chuck 50. After being carried to a position directly overlying the fixture 38 and partially lowered therein, each wafer is released as before just above the supporting fixture tabs. Subsequently, the arm 32 is rotated to cause the chuck affixed thereto to engage the wafer retained in the fixture 38. The wafer is thereby carried to the position occupied by the wafer 30 shown in FIG. 1. Then, by means of the conveyer belt 28, the wafer is transported into an empty position in the cassette 26.

When a tray member has been completely unloaded in the manner described above, it may be manually replaced on the base portion 12 of FIG. 1 by another wafer-containing tray member. Another unloading cycle is thereby initiated to commence.

In accordance with a feature of the principles of the present invention, the various aforedescribed loading and unloading of a mounted tray member are carried out in an automatic manner. Illustratively, this is done by including a standard sequence controller unit 56 in the apparatus shown in FIG. 1. By way of example, the unit 56 comprises a commercially available microprocessor-based programmable sequencer. Input information applied to the unit 56 from the depicted apparatus includes wafer location, cassette status, whether a tray member is properly mounted on the base portion, the function to be performed by the apparatus (e.g., load, unload, stop or tray release), etc.

Other standard components included in the FIG. 1 apparatus include a stepping motor control panel 58 and control switches 60. By means of the panel 58, the acceleration and velocity of the stepping motor that drives the transport stage 46 can be controlled. The switches 60 are utilized by an attendant to control the overall mode of operation of the apparatus. The switch functions are: power on/off, load, unload, start, stop and tray release.

The specific illustrative apparatus shown in FIG. 1 is characterized by relatively low cost and high throughput. In practice, it is often advantageous to utilize one such apparatus with several processing systems. In that way, loading and unloading of all the wafer-carrying tray members of the several systems is carried out by a single wafer-handling apparatus of the type described herein.

Furthermore, the apparatus depicted in FIG. 1 is advantageous in that it is compact and occupies relatively little floor space. One specific illustrative embodiment thereof is only thirty-six inches long (measured in the x direction), 30 inches wide and approximately 31 inches high. Moreover, the various aforedescribed components of the compact apparatus are relatively easily monitored and readily available for modification and/or maintenance.

In accordance with a feature of the principles of the present invention, the basic design of each of the chucks 40 and 50 included in the apparatus shown in FIGS. 1 and 4 is the same. The chucks embody a unique design that constitutes an integral and vital part of the overall wafer handling apparatus described herein. In particular, the unique chuck design imparts significant operating characteristics to the depicted apparatus.

The wafer chuck design embodied in the FIG. 1 apparatus meets several different requirements imposed during the various operating modes of the apparatus. For example, at the initial loading position shown in FIG. 1, the wafer 30 is picked up by the chuck 40 affixed to the arm 32. The chuck 40 is in motion when it first contacts the underside of the wafer 30. And, since there is no counterforce acting on the topside of the wafer 30, the initial chuck contact with the wafer must be effective to engage the wafer surface relatively quickly and softly. Otherwise, the wafer 30 could be actually batted out of the depicted loading position without being engaged by the chuck.

Additionally, each of the chucks included in the FIG. 1 apparatus is required at different times to pick up a wafer retained in the fixture 38. Such a wafer is supported firmly and nonresiliently in the fixture by the aforespecified tabs including the tabs 42 and 44 shown in FIG. 4. Accordingly, to avoid breakage of a wafer, each chuck must contact the top surface of the supported wafer in a relatively precise and soft manner.

Furthermore, removal of wafers from a tray member imposes additional special requirements on the chuck design. The plane of the top surface of a retained wafer is not necessarily parallel to the plane of the top surface of the base portion 12 (FIG. 1). The surface of the engaged wafer typically deviates from parallelism depending on the spring tension of the associated spring-clip elements. To qualify as a dependable pickup device, the chuck must be able to conform to these positional variations.

And, despite its initially compliant nature, the chucks included in the FIG. 1 apparatus must also be able to provide a firm support for an engaged wafer. In particular, during certain release or insertion steps, it is critical that an engaged wafer be maintained precisely in a predetermined orientation.

Figure 2:
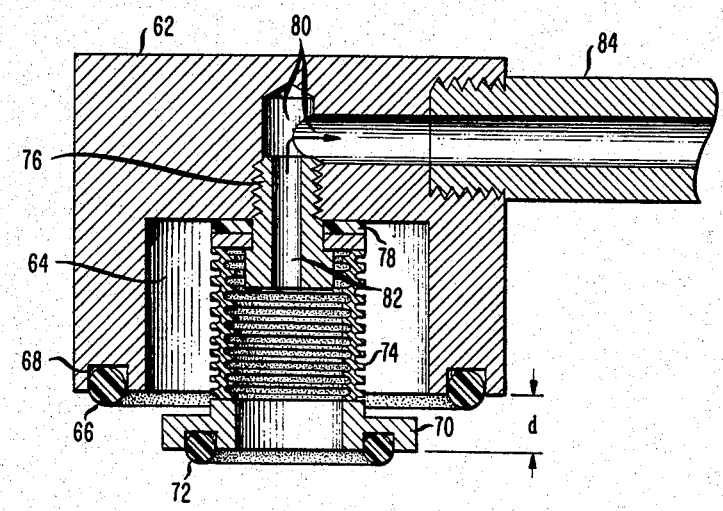
FIGS. 2 and 3 are cross-sectional views of a unique wafer vacuum chuck included in the FIG. 1 apparatus.
Figure 3:
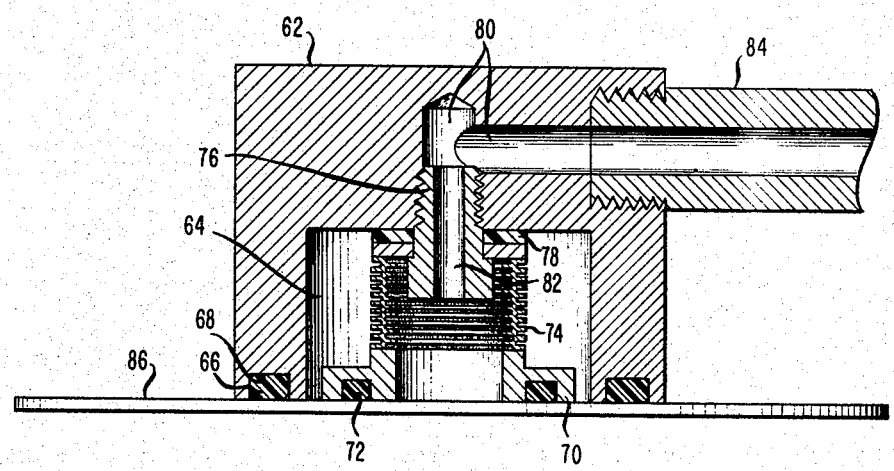

A specific illustrative vacuum chuck made in accordance with the principles of this invention and possessing the characteristics specified above is shown in cross-section in FIGS. 2 and 3. The depicted chuck is adapted to be mounted on the transport stage 46 or to be affixed to the free end of the flipper arm 32 of the FIG. 1 apparatus. But other uses for the chucks in other handling applications are, of course, feasible. And, moreover, a variety of disk-like elements other than semiconductor wafers are capable of being handled by the herein-considered chucks.

FIG. 2 shows a specific illustrative chuck made in accordance with the principles of this invention. The chuck is depicted in its quiescent state. In that state, no part of the chuck is yet in contact with a wafer to be picked up.

The chuck shown in FIG. 2 includes a rigid housing 62. Illustratively, the housing 62 constitutes a cylindrical body machined from a block of aluminum. The housing 62 includes a cylindrical chamber 64 centrally positioned in the lower portion of the housing. An O-ring 66 made, for example, of silicone rubber is force-fitted into a groove 68 formed in the lower face of the housing 62. The lower surface of the O-ring 66 defines a plane which is designed to contact one main planar surface of a wafer to be picked up. This plane is parallel to the reference plane defined by the lower face of the housing 62. A rigid grooved ring member 70 (FIG. 2) made, for example, of metal extends below the aforespecified plane defined by the lower surface of the rigid housing 62. (In one specific illustrative embodiment, the distance d indicated in FIG. 2 is approximately 0.2 inches.) A relatively small-diameter O-ring 72 also made, for example, of silicone rubber is force fitted into the groove in the member 70. In turn, the member 70 is attached to a standard bellows 74 by any suitable means such as brazing. The bellows constitutes a flexible compressible member made, for example, of stainless steel.

The assembly comprising the bellows 74 and the ring member 70 attached thereto is secured to the top of the cylindrical chamber 64 by means of a screw 76. Interposed between the top of the bellows 74 and the top of the chamber 64 is a standard gasket 78.

The screw 76 shown in FIG. 2 extends into a passageway 80 formed in the housing 62. A lower portion of the passageway 80 is threaded to engage the screw 76. Further, a passageway 82 is formed in the screw 76.

A standard vacuum line 84 is attached to the housing 62 of FIG. 2. The hollow core of the line 84 mates with the opening 80 in the housing. Thus, by means of the line 84, a relatively low pressure or "vacuum" condition can be established within the bellows 74 when a suitable planar member such as a wafer is in contact with the lower surface of the O-ring 72.

The flexible bellows 74 (FIG. 2) imparts a compliant self-aligning characteristic to the O-ring 72 secured in the member 70. As a result, the lower surface of the O-ring 72 is adapted to intimately contact planar surfaces that are not parallel to the reference plane defined by the lower surface of the rigid housing 62.

In operation, the chuck shown in FIG. 2 is moved downward toward the surface of a wafer to be picked up. During such initial movement, vacuum is not applied to the line 84. Subsequently, the aforespecified compliant assembly including the O-ring 72 touches the wafer surface and establishes intimate contact therewith. After the bellows is thereby moved upward and mechanically compressed about 0.1 inches, vacuum is applied to the assembly via the line 84. In response thereto, the bellows is further compressed by atmospheric pressure whereby the contacted wafer is drawn up until it engages and compresses the O-ring 66. At that point, the wafer is held firmly in a prespecified orientation. This condition is represented in FIG. 3 wherein a wafer 86 is shown held by the depicted chuck. As indicated, the O-ring 66 has been sufficiently compressed into the groove 68 to allow the upper surface of the wafer 86 to contact the bottommost surface of the rigid housing 62. As noted, this surface constitutes the aforementioned reference plane of the herein-considered chuck. (In other embodiments, as indicated in FIG. 4, the O-ring 66 is compressed but maintains the upper surface of the wafer slightly spaced apart from the bottommost surface of the rigid housing.)

Finally, it is to be understood that the abovedescribed arrangements and techniques are only illustrative of the principles of the present invention. In accordance with these principles, numerous modifications and alternatives may be devised by those skilled in the art without departing from the spirit and scope of the invention.

What is claimed is:

1. A method for handling wafers in a device fabrication sequence, said method comprising the steps of
    transporting a wafer active side up from a storage medium to an initial loading position,
    engaging the inactive side of the wafer with a first pickup device,
    transporting the wafer to a fixture,
    depositing the wafer in the fixture inactive side up,
    engaging the inactive side of the wafer with a second pickup device mounted on a transport stage,
    moving the transport stage to a position directly overlying a wafer-receiving aperture in a tray member,
    and, by means of said second-mentioned pickup device, inserting the wafer inactive side up into said aperture,
    wherein at least three spaced-apart spring-clip elements are mounted on said tray member peripherally disposed around the aperture for resiliently engaging a wafer,
    wherein said method further comprises the steps of
    by means of pistons mounted on said transport stage, retracting said spring-clip elements before the wafer is inserted into the aperture in said tray member,
    and, after insertion, disengaging the pistons from said spring-clip elements to allow the elements to resiliently engage the inserted wafer.

2. A method for handling wafers in a device fabrication sequence, said method comprising the steps of
    by means of a first pickup device mounted on a transport stage, engaging the inactive side of a wafer mounted in an aperture in a wafer-carrying tray member thereby removing the wafer from said tray member,
    moving the transport stage and the wafer engaged by the pickup device thereof to a position directly overlying a wafer-receiving fixture,
    depositing the wafer inactive side up in said fixture,
    engaging the inactive side of the wafer with a second pickup device,
    transporting the wafer to and depositing it active side up at a loading position,
    and moving the wafer by means of a conveyor from said loading position to a storage medium,
    wherein at least three spaced-apart spring-clip elements are mounted on said tray member peripherally disposed around the aperture for resiliently engaging said wafer,
    wherein said method further comprises the step of
    by means of pistons mounted on said transport stage, retracting said spring-clip elements before the wafer is removed from said tray.

* * * * *